United States Patent
Hatcher, Jr. et al.

(10) Patent No.: US 8,440,012 B2
(45) Date of Patent: May 14, 2013

(54) ATOMIC LAYER DEPOSITION ENCAPSULATION FOR ACOUSTIC WAVE DEVICES

(75) Inventors: Merrill Albert Hatcher, Jr., Greensboro, NC (US); Jayanti Jaganatha Rao, Jamestown, NC (US); John Robert Siomkos, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 5 days.

(21) Appl. No.: 13/232,319

(22) Filed: Sep. 14, 2011

(65) Prior Publication Data

US 2012/0091855 A1    Apr. 19, 2012

Related U.S. Application Data

(60) Provisional application No. 61/392,649, filed on Oct. 13, 2010.

(51) Int. Cl.
| | | |
|---|---|---|
| *C09D 1/00* | (2006.01) | |
| *C09K 17/40* | (2006.01) | |
| *H01L 41/09* | (2006.01) | |
| *H03H 9/25* | (2006.01) | |

(52) U.S. Cl.
USPC ............ 106/286.5; 106/287.17; 310/313 R; 310/340

(58) Field of Classification Search ............ 106/286.5, 106/286.17, 286.19; 204/102.17; 257/76; 438/127; 310/313 R, 340
See application file for complete search history.

(56) References Cited

U.S. PATENT DOCUMENTS

| | | | |
|---|---|---|---|
| 3,584,264 | A | 6/1971 | McLouski et al. |
| 3,766,445 | A | 10/1973 | Reuter et al. |
| 6,771,070 | B2 | 8/2004 | Lee |
| 6,856,007 | B2 | 2/2005 | Warner |
| 6,949,475 | B2 | 9/2005 | Lee |
| 7,268,426 | B2 | 9/2007 | Warner et al. |
| 7,501,706 | B2 | 3/2009 | Lee |
| 7,863,090 | B2 | 1/2011 | Eichelberger et al. |
| 8,034,664 | B2 | 10/2011 | Kwon et al. |
| 8,313,985 | B2 | 11/2012 | Hatcher, Jr. et al. |
| 2003/0143319 | A1 | 7/2003 | Park et al. |
| 2005/0151238 | A1 | 7/2005 | Yamunan |
| 2007/0105283 | A1 | 5/2007 | Kobayashi et al. |
| 2008/0064791 | A1 | 3/2008 | Zenbutsu |
| 2008/0119098 | A1 | 5/2008 | Palley et al. |
| 2008/0315377 | A1 | 12/2008 | Eichelberger et al. |
| 2009/0310317 | A1 | 12/2009 | Horten et al. |

(Continued)

OTHER PUBLICATIONS

Notice of Allowance for U.S. Appl. No. 13/232,330 mailed Jul. 19, 2012, 10 pages.
Notice of Allowance for US patent application 13,654,894 mailed Mar. 19, 2013, 9 pages.

*Primary Examiner* — Thomas Dougherty
(74) *Attorney, Agent, or Firm* — Withrow & Terranova, P.L.L.C.

(57) ABSTRACT

Acoustic wave devices and methods of coating a protective film of alumina ($Al_2O_3$) on the acoustic wave devices are disclosed herein. The protective film is applied through an atomic layer deposition (ALD) process. The ALD process can deposit very thin layers of alumina on the surface of the acoustic wave devices in a precisely controlled manner. Thus, the uniform film does not significantly distort the operation of the acoustic wave device.

13 Claims, 17 Drawing Sheets

U.S. PATENT DOCUMENTS

2010/0164079 A1 7/2010 Dekker et al.
2011/0045209 A1 2/2011 Seleznev
2012/0091855 A1 4/2012 Hatcher, Jr. et al.
2012/0097970 A1* 4/2012 Siomkos et al. ............ 257/76

* cited by examiner

ATOMIC LAYER DEPOSITION ENCAPSULATION FOR ACOUSTIC WAVE DEVICES

RELATED APPLICATIONS

This application claims the benefit of provisional patent application Ser. No. 61/392,649, filed Oct. 13, 2010, the disclosure of which is hereby incorporated herein by reference in its entirety. This application is also related to a concurrently filed utility application entitled Atomic Layer Encapsulation for Power Amplifier Circuits in RF Circuits, the disclosure of which is incorporated herein by reference in its entirety.

FIELD OF THE DISCLOSURE

This disclosure relates to acoustic wave devices with protective coatings and methods of forming the protective coating on the acoustic wave devices.

BACKGROUND

Acoustic wave devices are built on piezoelectric substrates, which convert electrical energy into mechanical energy and vice versa. Acoustic wave devices are used in a variety of ways. For example, radio frequency (RF) circuits often use acoustic wave devices as RF filters. The RF filters may be formed by one or more interdigital transducers (IDTs) built on a piezoelectric substrate. An RF input signal may be received by an IDT, which induces a mechanical response in the piezoelectric substrate that causes the piezoelectric substrate to stretch and compress thereby propagating acoustic waves. These propagating acoustic waves cause the piezoelectric substrate to generate a voltage based on the longitudinal and/or shear vector components of the acoustic waves. In turn, these voltages generate a filtered RF output signal on the IDT or on another IDT built on the piezoelectric substrate. Acoustic wave devices may also be utilized to form other types of electronic devices in RF circuits such as resonators, sensors, transformers, and the like.

To maintain these acoustic wave devices from being damaged, acoustic wave devices need to be protected from moisture, temperature variations, and other environmental conditions. Acoustic wave devices are thus often provided in hermetically sealed packages. Unfortunately, hermetically sealed packages may be expensive, difficult to manufacture, and have limited life spans. Also, these hermetically sealed packages can significantly increase the volume consumed by the acoustic wave device.

Rather than using hermetically sealed packages, it would be desirable to provide a protective film over the acoustic wave device. Protective films have been shown to effectively protect other types of electronic devices from environmental conditions. However, sputtering deposition processes and chemical vapor deposition (CVD) processes form protective films that are too thick for acoustic wave devices. The thickness of these protective films shift the resonant frequency and introduce unacceptably high insertion losses into the transfer function of the acoustic wave device. Furthermore, these protective films may have temperature expansion coefficients that are significantly different than those of the metallic components of the acoustic wave device. In turn, this may damage the protective coating and thus allow moisture to penetrate the protective coating.

Finally, the aforementioned deposition techniques do not provide protective films with sufficient uniformity. For instance, sections on the surface of the acoustic wave device may have high aspect ratios and create shadow areas that do not receive as much protective material during the sputtering deposition process or the CVD process. These shadowed areas may cause significant variations in the thickness of the protective film, which further alters the transfer function of the acoustic wave device, and may cause the protective film to have pin-holes and voids that expose the acoustic wave device to moisture and other environmental conditions.

Thus, a protective film is needed on the acoustic wave device that is thinner and more uniform than those provided by the aforementioned deposition processes. Also needed are methods of forming this thinner and more uniform protective film on the surface of the acoustic wave device.

SUMMARY

The disclosure relates to acoustic wave devices coated with a protective film of alumina ($Al_2O_3$) and an atomic layer deposition (ALD) process for coating the protective film on a surface of the acoustic wave device. The ALD process can deposit very thin layers of alumina on the surface of the acoustic wave device in a precisely controlled manner. Thus, the ALD process protects the acoustic wave device and can apply a thin coating over the acoustic wave device so as to not significantly interfere with the mechanical response of the acoustic wave device. Also, the ALD process can deposit the layers of the film so that the film is substantially free from pin-holes, voids, and variations in thickness. Furthermore, alumina has a temperature expansion coefficient similar to that of aluminum and thus temperature variations may have less of an effect on acoustic wave devices built with aluminum metallic components.

To coat the acoustic wave device with the film of alumina, the surface of the acoustic wave device may be hydroxilated within a reaction chamber. Next, during a first time period of a layer deposition cycle, a first precursor is introduced into the reaction chamber. In one embodiment, the first precursor is a trimethyaluminum gas ($Al(CH_3)_3$) that reacts with the hydroxilated surface to form a monolayer of methyaluminumoxane ($OAl(CH_3)_2$). In the initial layer deposition cycle, the surface that reacts with the first precursor is the surface of the acoustic wave device. In subsequent layer deposition cycles, the surface that reacts with the first precursor is the surface of the monolayer formed by an earlier layer deposition cycle.

After introducing the first precursor within the reaction chamber and during a second time period of the layer deposition cycle, the reaction chamber may be purged and/or evacuated to remove excess amounts of the trimethyaluminum gas and any byproducts of the reaction. Next, a second precursor, such as water vapor ($H_2O$), is introduced into the chamber during a third time period of the layer deposition cycle. The second precursor reacts with the methyaluminumoxane of the monolayer and so that the monolayer is made of alumina. After the reaction, the alumina in this monolayer is bonded to hydroxyl (OH) so that the surface of the monolayer is hydroxylated. During a fourth time period of the layer deposition cycle, the reaction chamber may again be purged or evacuated to remove excess amounts of unreacted water vapor and the byproducts of the second reaction. By repeating the process, the film may be built one monolayer at a time to a desired thickness.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
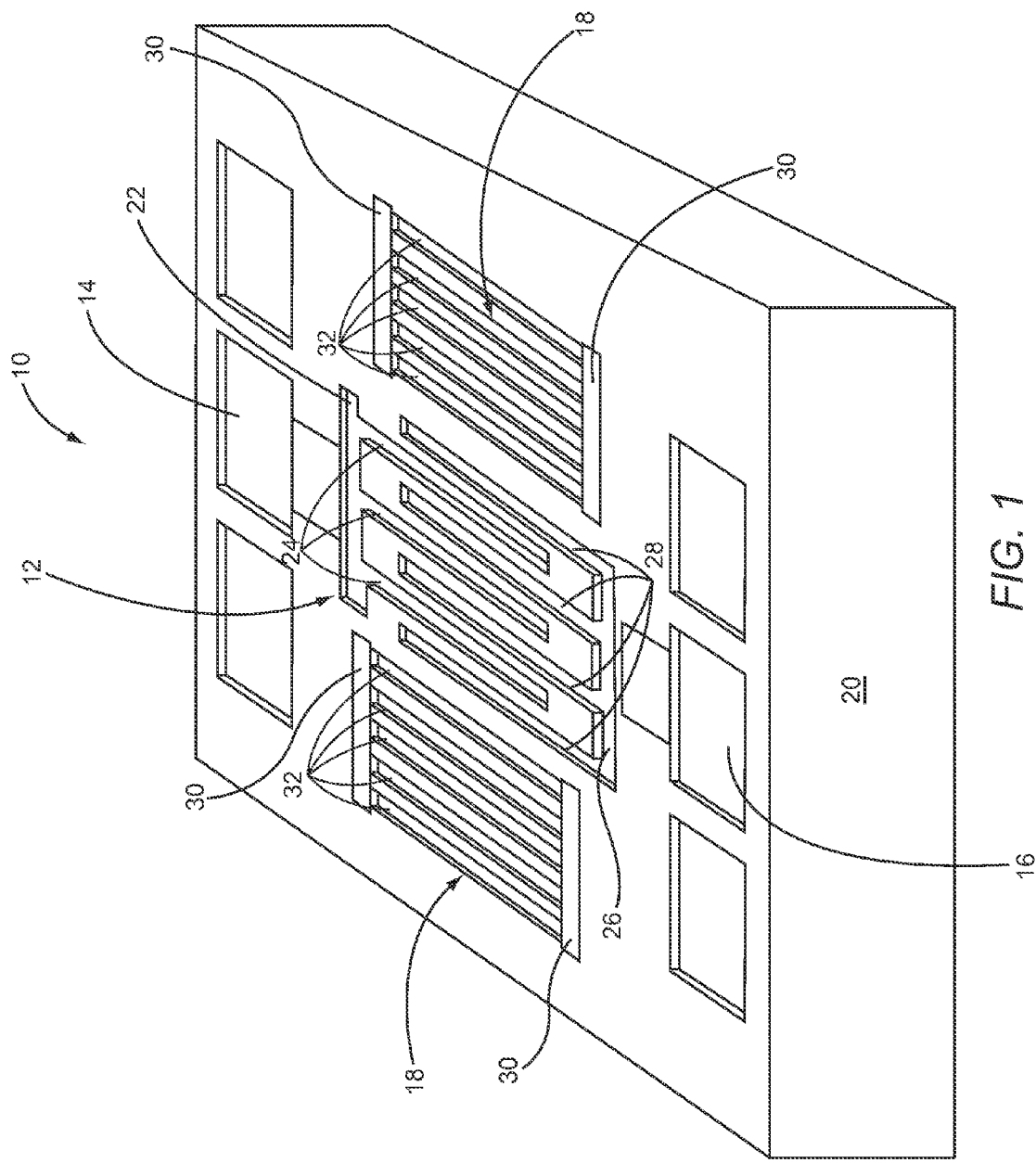
FIG. 1 illustrates one embodiment of a surface acoustic wave device.

FIG. 1 illustrates one embodiment of an acoustic wave device 10, which in this example is a surface acoustic wave (SAW) device that is configured as a SAW filter for a radio frequency (RF) circuit (not shown). In this example, the acoustic wave device 10 has an interdigital transducer (IDT) 12, an input pad 14, an output pad 16, reflectors 18, and a piezoelectric substrate 20. The IDT 12, the input pad 14, the output pad 16, and the reflectors 18, are formed in or on the piezoelectric substrate 20 and are perhaps made from aluminum (Al). However, the metallic components in the acoustic wave device 10 may be made from any type of conductive material. For example, the IDT 12, the input pad 14, the output pad 16, and the reflectors 18 may also be made from conductive materials such as copper (Cu), gold (Au), silver (Ag), or Nickel (Ni). In addition, the metallic material may also include metallic alloys or other metallic materials mixed with or forming ionic or covalent bonds with other non-metallic materials to provide a desired conductive and/or thermodynamic property.

The acoustic wave device 10 also has a piezoelectric substrate 20 that allows for the transduction of electrical energy and mechanical energy and may be made from any type of suitable piezoelectric material such as quartz ($SiO_2$ in silicon-oxygen tetrahedra), lithium niobate ($LiNbO_3$), lanthanum gallium silicate ($L_{a3}G_{a5}SiO_{14}$), lithium tantalite ($LiTaO_3$), gallium arsenide (GaAs), silicon carbide (SiC), zinc oxide (ZnO), aluminum nitride (AlN), lead zirconium titanate (Pb$[Zr_xTi_{1-x}]O_3$ 0<x<1), and the like. The input pad 14 receives an RF input signal, which may be generated by the RF circuit externally from the acoustic wave device 10, and is connected to a first track 22 of the IDT 12. The first track 22 transmits the RF input signal along a first set of metallic fingers 24 and thus creates a variable voltage on the IDT 12.

The piezoelectric substrate 20 compresses and stretches in accordance with the variable voltage across the first set of metallic fingers 24 thereby causing the propagation of acoustic waves across the piezoelectric substrate 20. These acoustic waves cause the piezoelectric substrate 20 to generate an electromagnetic field in accordance with the longitudinal vector components and shear vector components of the acoustic waves. A second track 26 of the IDT 12 having a second set of metallic fingers 28 is interleaved with the first set of metallic fingers 24. The electromagnetic field generated by the piezoelectric material creates a variable voltage on the second set of metallic fingers 28 and the second track 26 receives an RF output signal. The RF output signal may then be externally to the RF circuit through the output pad 16. The reflectors 18 are provided on either side of the IDT 12 to help increase the efficiency of the acoustic wave device 10 by reflecting the acoustic waves back to the IDT 12. These reflectors 18 also have reflector tracks 30 and sets of metallic fingers 32, which are provided in a grated configuration.

Note, that the topology shown in FIG. 1 for the acoustic wave device 10 is simply illustrative, and the acoustic wave device 10 may have any type of topology depending on the desired characteristics and function of the acoustic wave device 10. For example, the acoustic wave device 10 may have a different topology so that the acoustic wave device 10 operates as a resonator, transformer, or sensor. In addition, the acoustic wave device 10 may be a bulk acoustic wave (BAW) device, where the acoustic waves propagated by the piezoelectric substrate 20 are bulk acoustic waves rather than the surface acoustic waves described above.

Figure 2:
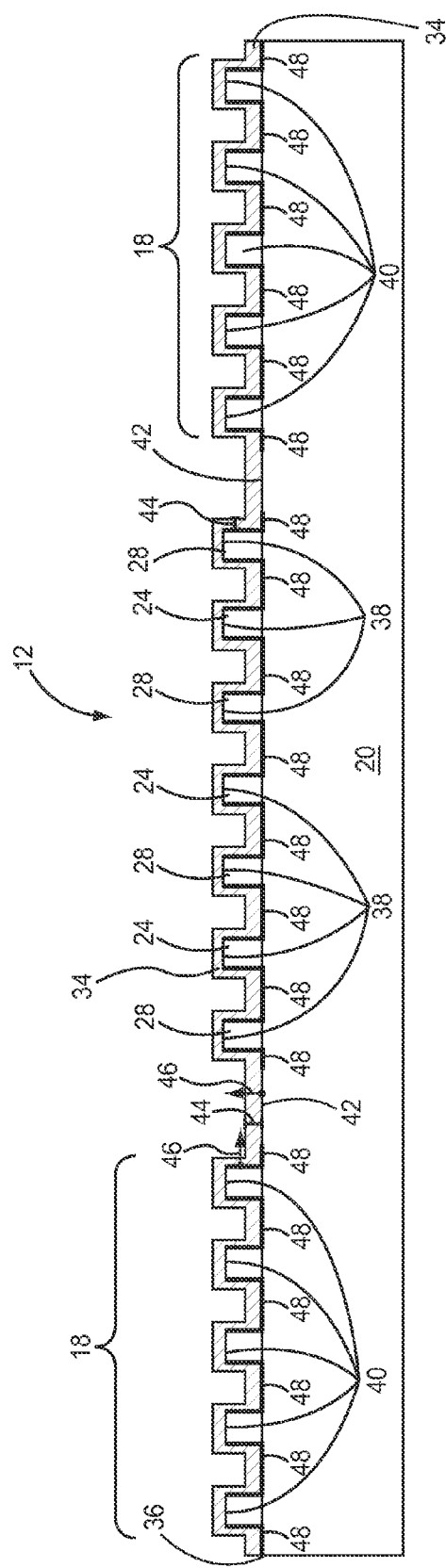
FIG. 2 is a cross-sectional view of the surface acoustic wave device shown in FIG. 1 with a film of alumina formed over a surface of the acoustic wave device.

FIG. 2 illustrates a cross sectional view of the acoustic wave device 10 of FIG. 1. As shown by FIG. 2, a film 34 of alumina ($Al_2O_3$) that has been provided over a surface 36 of the acoustic wave device 10 to protect the acoustic wave device 10 from the environment. In this embodiment, the surface 36 of the acoustic wave device 10 covered by the film 34 includes a surface 38 of the IDT 12, a surface 40 of the reflectors 18, and a surface 42 of the piezoelectric substrate 20. FIG. 2 specifically shows the film 34 covering the surface 38 of the metallic fingers 24, 28, 30 of the IDT 12, and the surface 42 of the piezoelectric substrate 20. Note however that other metallic components may be covered by the film 34, such as the first track 22, second track 26, and reflector tracks 30.

The surface 36 covered by the film 34 in FIG. 2 is the entire top surface of the acoustic wave device 10. However, in alternative embodiments, the film 34 may cover less, more, or a different surface than that shown in FIG. 2. For example, the surface 36 covered by the film 34 may be the surface along the entire periphery of the acoustic wave device 10 and thus the film 34 would completely encapsulate the acoustic wave device 10. Utilizing an atomic layer deposition (ALD) method described below, the film 34 may be provided to have a thickness 44 between around 50 Angstroms and 300 Angstroms. The thickness 44 may depend on the protection required by the acoustic wave device 10, in addition to factors such as manufacturing time, the particular topology and function of the acoustic wave device 10. However, the thickness of 50 Angstroms and 300 Angstroms is very thin relative to the capabilities of other deposition processes, such as sputtering deposition processes and chemical vapor deposition (CVD) processes, but does not add insertion losses in the acoustic wave device 10 or adds them within acceptable limits. Furthermore, the thickness 44 of the film 34 may be provided to be substantially uniform along the surface 36 meaning that a distance normal 46 to the surface plane and the top of the film 34 is substantially the same along the surface 36. As shown in FIG. 2, the different structures of the acoustic wave device 10 may cause the surface 36 to have different vertical levels. In turn, this may cause what may be referred to as shadow areas 48, since these shadow areas 48 are at least partially obscured by the structures on the surface 36. However, the thickness 44 of the film 34 on the shadow areas 48 remains substantially uniform with the thickness 44 of the film 34 on other sections of the surface 36. In this manner, the film 34 does not cause significant variations in the propagation characteristics of the IDT 12, reflectors 18, and piezoelectric substrate 20. Also, the film 34 is devoid of pin-holes, voids, or areas without sufficient protective material.

Figure 3:
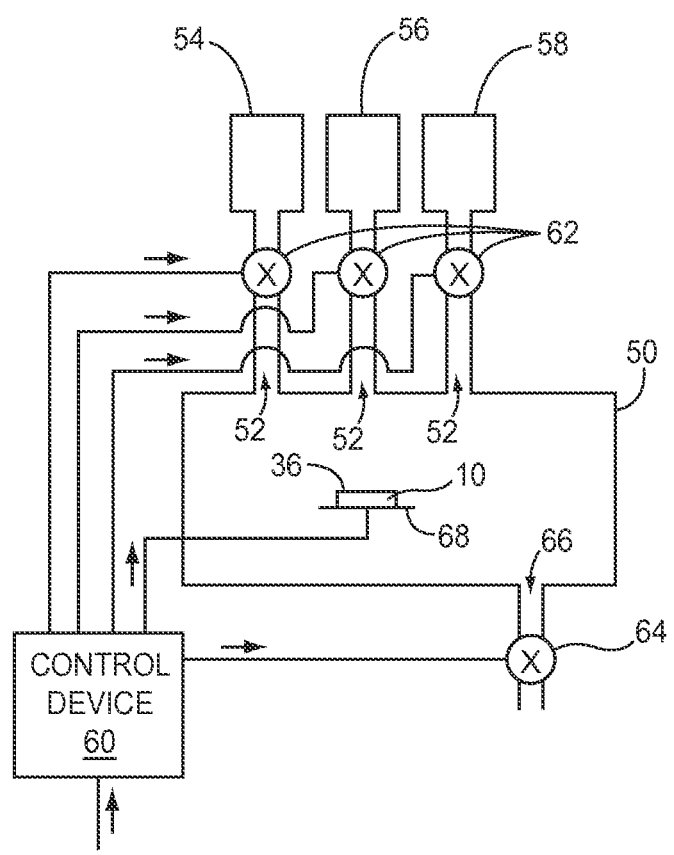
FIG. 3 illustrates one embodiment of a reaction chamber for forming the film of alumina on the acoustic wave device shown in FIG. 1.

FIG. 3 shows the acoustic wave device 10 in a reaction chamber 50 prior to forming the film 34 (shown in FIG. 2) over the surface 36. To form the film 34 over the surface 36 of the acoustic wave device 10, an ALD process is performed within the reaction chamber 50. The reaction chamber 50 may have a plurality of inlets 52 each leading to different storage vessels 54, 56, 58. The first storage vessel 54 may store a first precursor, the second storage vessel 56 may store a second precursor, and the third storage vessel 58 may store an inert gas. The reaction chamber 50 may have a control device 60 that controls the flow rates of the first precursor, the second precursor, and the inert gas into the reaction chamber 50. The control device 60 may be a hardwired device or may be a computer device storing computer-executable software instructions that are executed by one or more processors to control the flow rates of the first precursor, the second precursor, and the inert gas. To do this, the control device 60 may generate control signals that are received by flow controllers 62. The flow controllers 62 determine when and how much of the first precursor, second precursor, and inert gas is introduced within the reaction chamber 50 through the inlets 52 and thus control the flow rates from the storage vessels 54, 56, 58. The control device 60 may also control the flow controller 64 for an outlet 66 of the reaction chamber 50 so that materials can exit the reaction chamber 50. For example, the flow controller 64 may open a valve to create a vacuum within the reaction chamber 50 that forces the evacuation of material from the reaction chamber 50 through the outlet 66.

The control device 60 may be configured to implement a plurality of layer deposition cycles for the ALD process, which are explained in further detail below. Each layer deposition cycle may deposit a molecular layer of alumina over the surface 36 of the acoustic wave device 10 and these molecular layers can be stacked over one another to form the film 34. These molecular layers may be as fine as a monolayer or up to 40 molecules in thickness. Monolayers are layers that are one molecule in thickness and thus monolayers of alumina may be less than 0.1 Angstroms in thickness. Since each layer deposition cycle may deposit a single molecular layer as thin as a monolayer, the thickness 44 of the film 34 can be controlled with great accuracy by simply determining the number of layer deposition cycles. The control device 60 may also control a heating element 68 that may be utilized to control the temperature of the acoustic wave device 10 and thus the temperature of the surface 36 and the molecular layer formed over the surface 36. In this manner, the surface 36 and molecular layers are provided at the appropriate temperature for the ALD reactions in addition to allowing the control device 60 to control reaction rates.

The building of film 34 of alumina on the acoustic wave device 10 solves many of the problems of the CVD process and sputtering deposition processes. The uniformity and thinness of the film reduce the mass effects of the film 34 on the acoustic wave device 10. Furthermore, the components of the acoustic wave device 10 are often made from aluminum. The thermodynamic properties of alumina and aluminum are similar and thus temperature changes provide similar stretching and contraction on the film 34 and the components of the acoustic wave device 10 thereby further reducing the effects of film 34 on the performance of the acoustic wave device 10.

As explained in further detail below, the ALD process is a surface controlled process and because of the surface control, films 34 formed by the ALD process can be very conformal and uniform in thickness 44. Also, unlike sputtering deposition processes and CVD processes, there is less need for reactant flux homogeneity, which makes it easier to scale-up the ALD process and mass produce acoustic wave device 10 with films 34. The films 34 may have a thickness 44 of about 50 Angstroms to 300 Angstroms, which provides films that are sufficiently thin so as to either not introduce additional insertion losses into the transfer function of the acoustic wave device 10 or to maintain these insertion losses within acceptable limits. Furthermore, providing the thickness 44 between 50 Angstroms to 300 Angstroms also is sufficient to protect the acoustic wave device 10 from environmental conditions. However, the ALD process can provide a film 34 of any desired thickness over the surface 36 of the acoustic wave device 10, since the ALD process can form the film 34 one monolayer at a time. Currently, laboratory reactors deposit a monolayer in around 1 minute while manufacturing tools typically can deposit and form the monolayer in less than a second.

While the discussion in this disclosure focuses on the application of the film on a single acoustic wave device built on a single die, the discussion is equally applicable and is intended to cover the application of the film on a plurality of acoustic wave devices built on a plurality of dies at the wafer level. The film may be applied at the wafer level using the ALD process as part of the layer build up process or post processed to the finished wafer during the integrated circuit manufacturing process. Applying the film as part of the acoustic wave wafer fabrication process allows for scaling up for mass producing acoustic wave devices using the ALD process. It should be noted then that the ALD procedures discussed herein for the acoustic wave device built on a die are performed either when the procedures are performed on a acoustic wave device built on a separated die or on a acoustic wave device built on a wafer so that the ALD process is being performed simultaneously on other acoustic wave device (or other types of electronic devices) also built on the wafer.

Figure 4A:
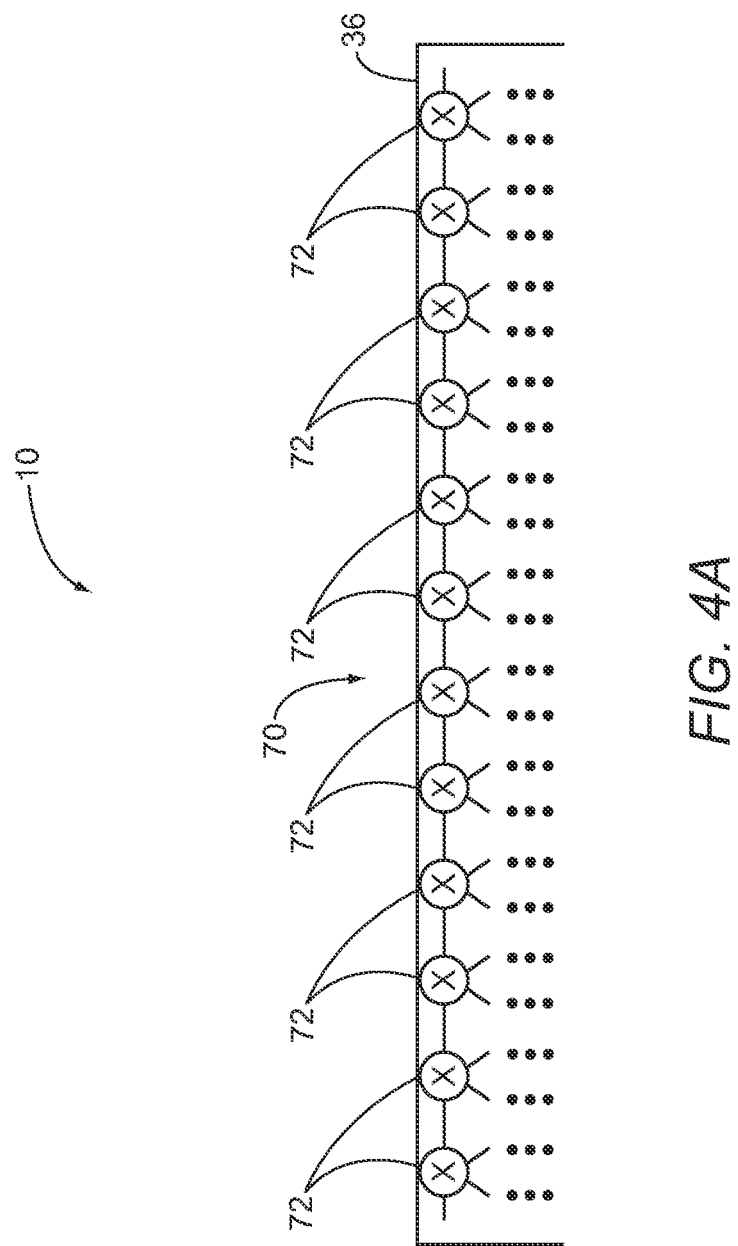
FIGS. 4A-4N illustrates procedures in one embodiment of an ALD process for forming the film on the acoustic wave device shown in FIG. 2.
Figure 4B:
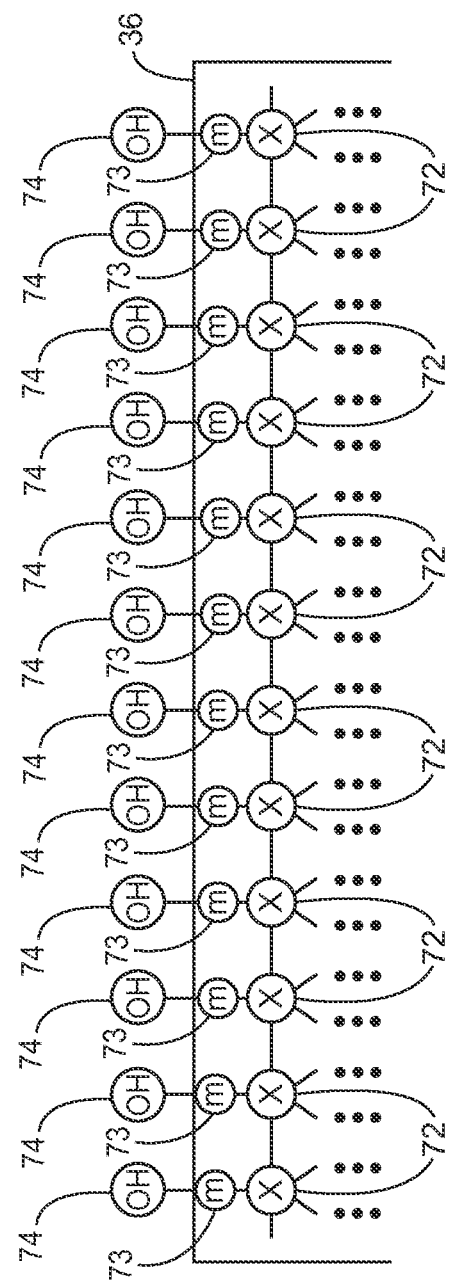
Figure 4C:
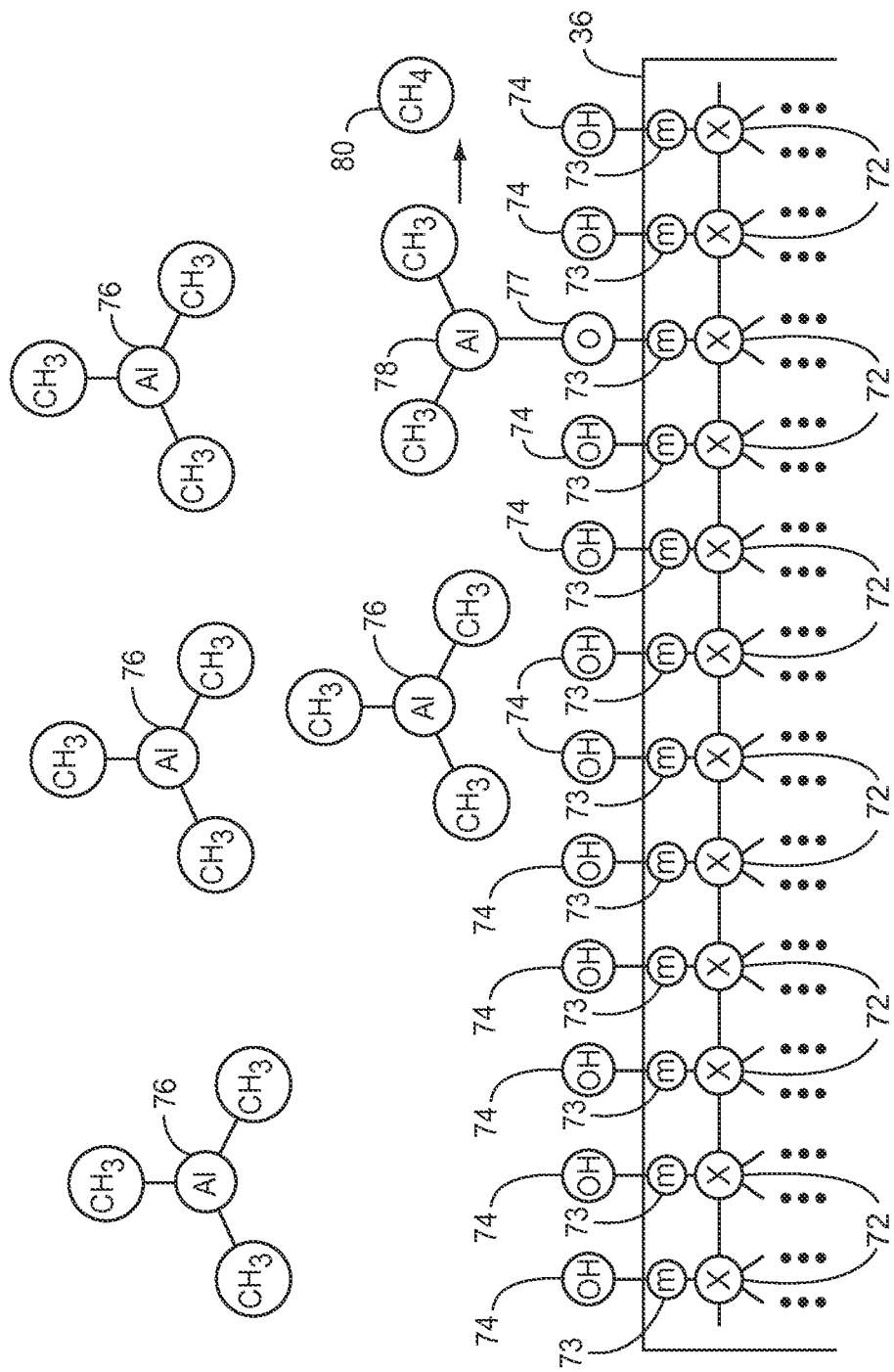
Figure 4D:
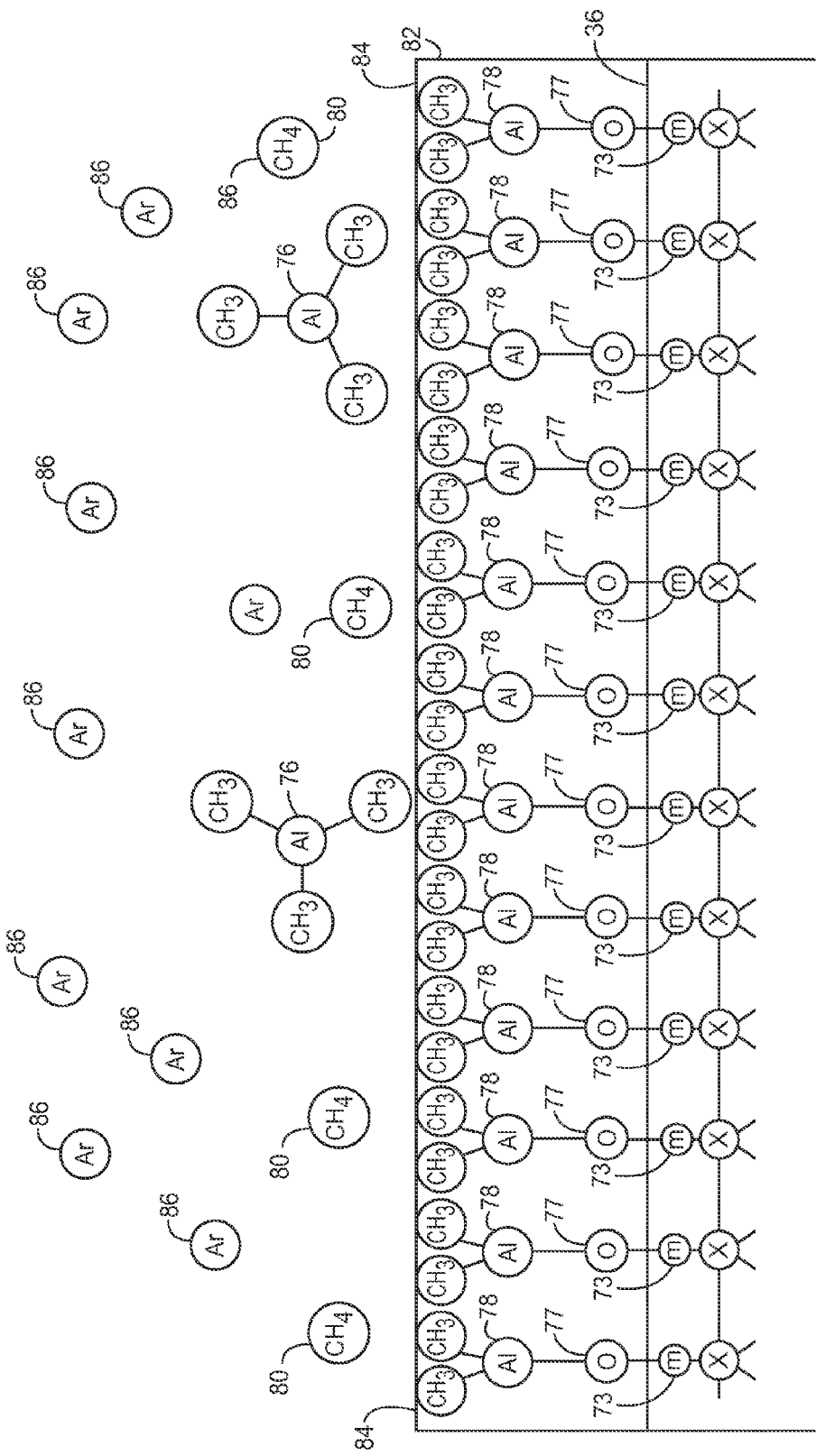
Figure 4E:
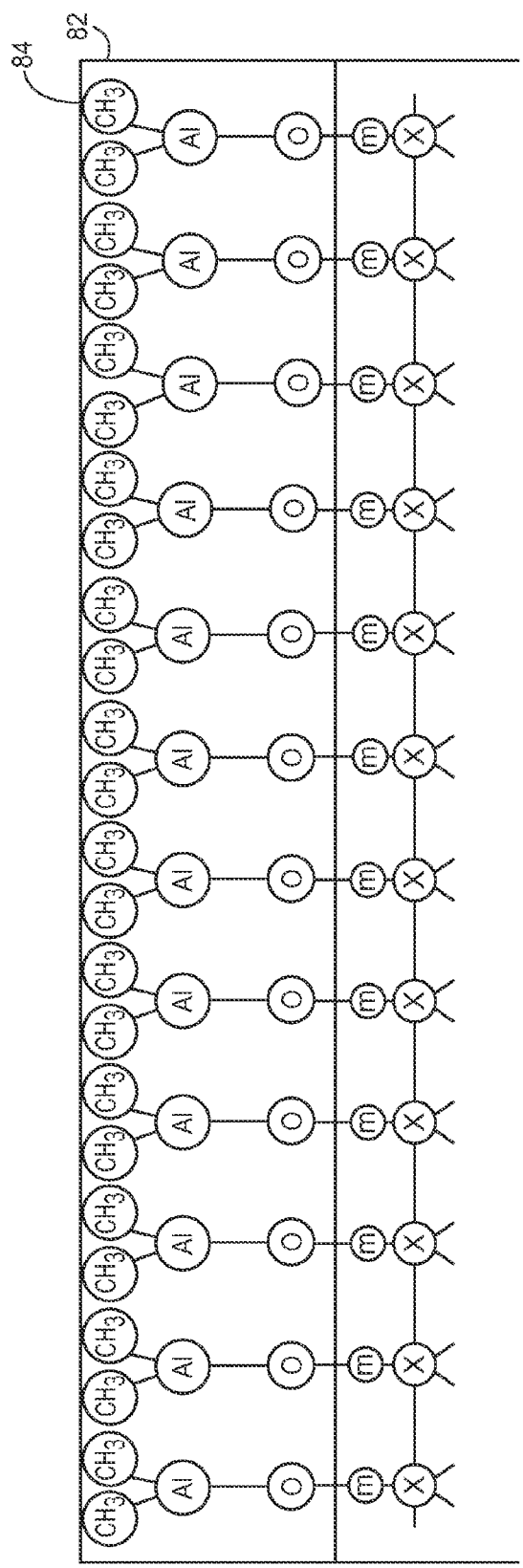
Figure 4F:
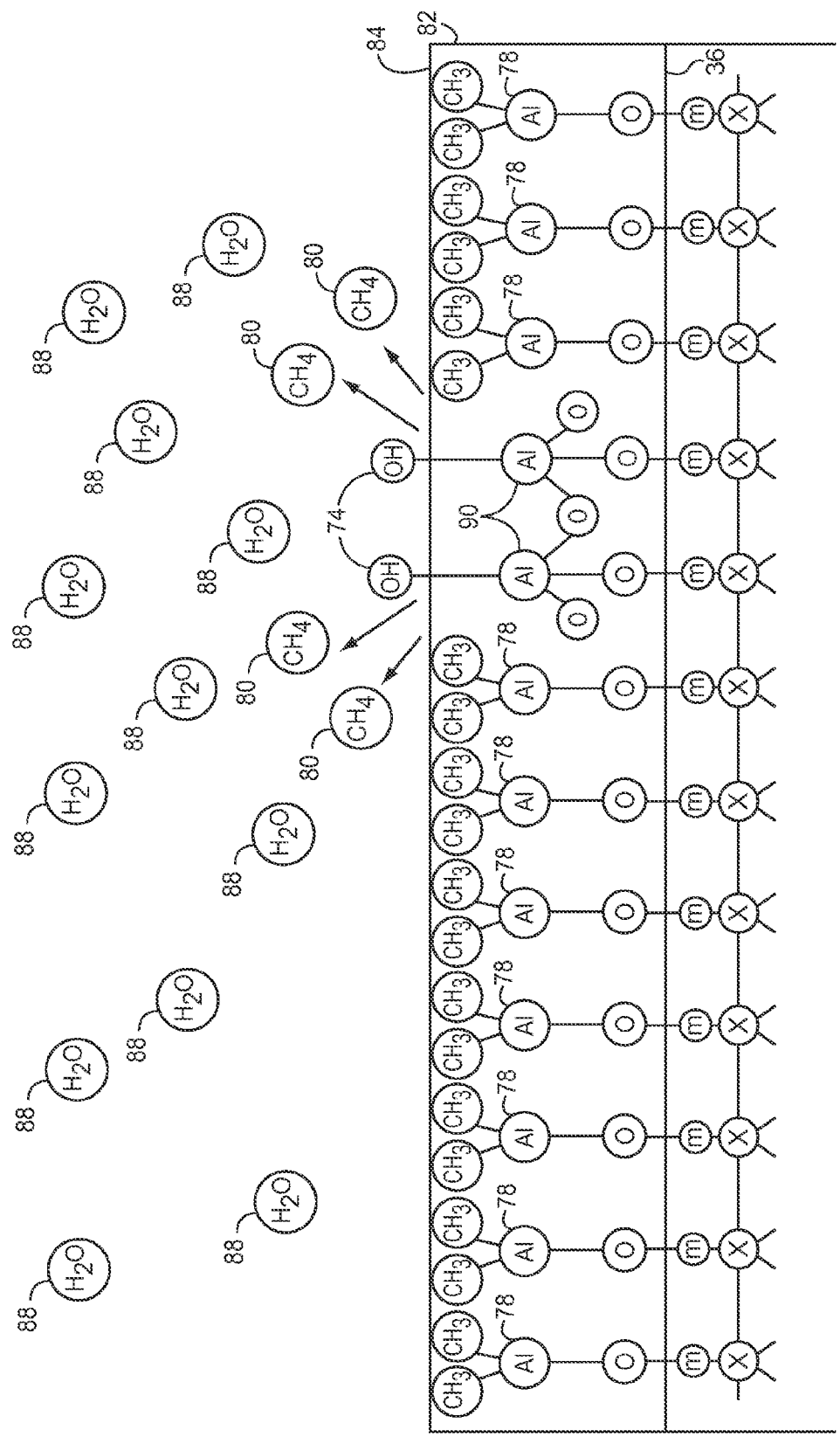
Figure 4G:
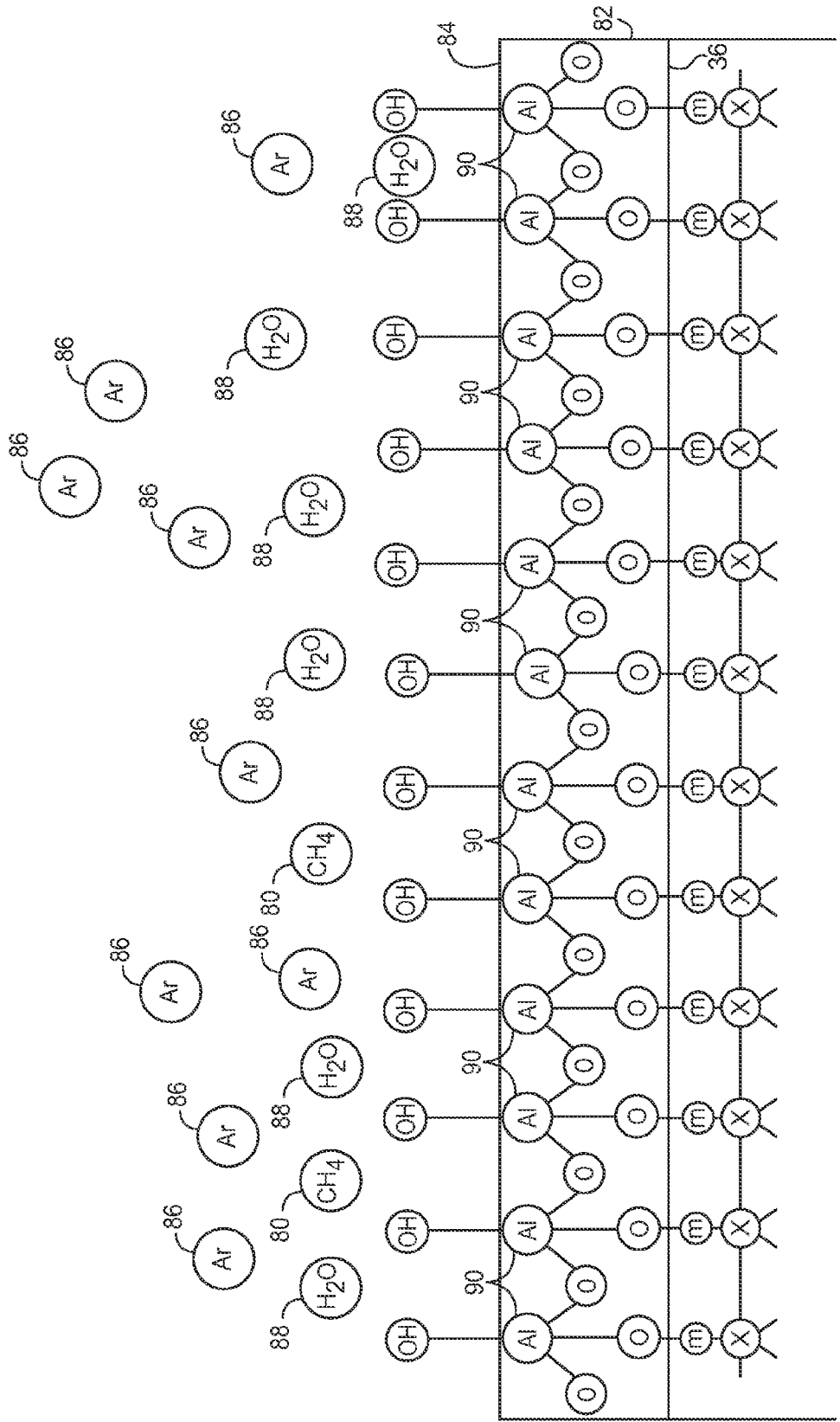
Figure 4H:
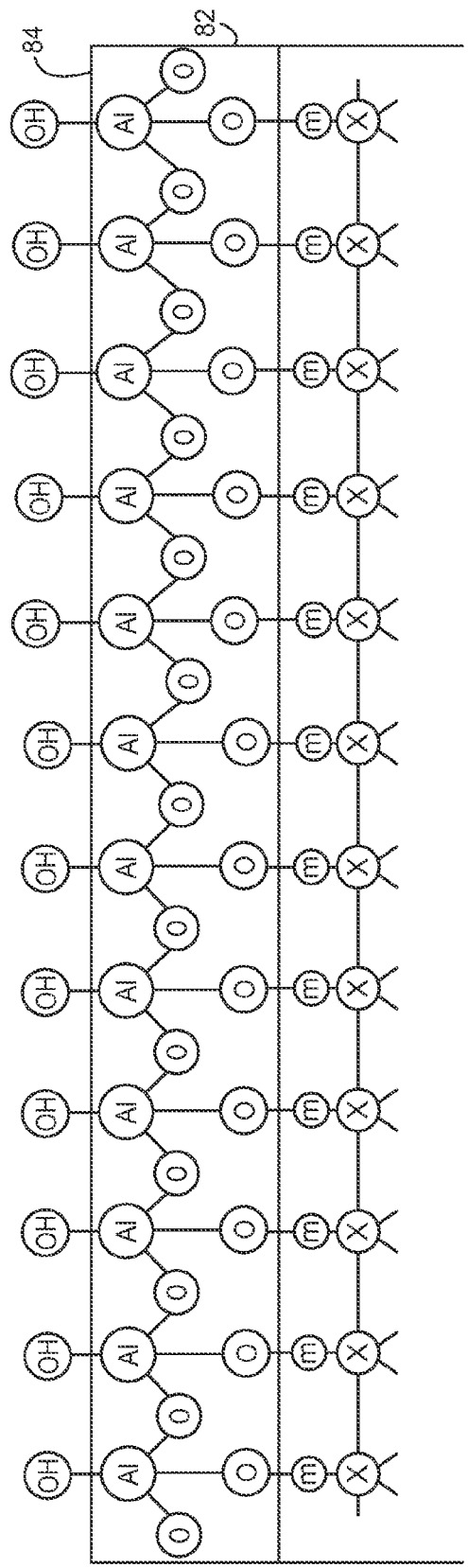
Figure 4I:
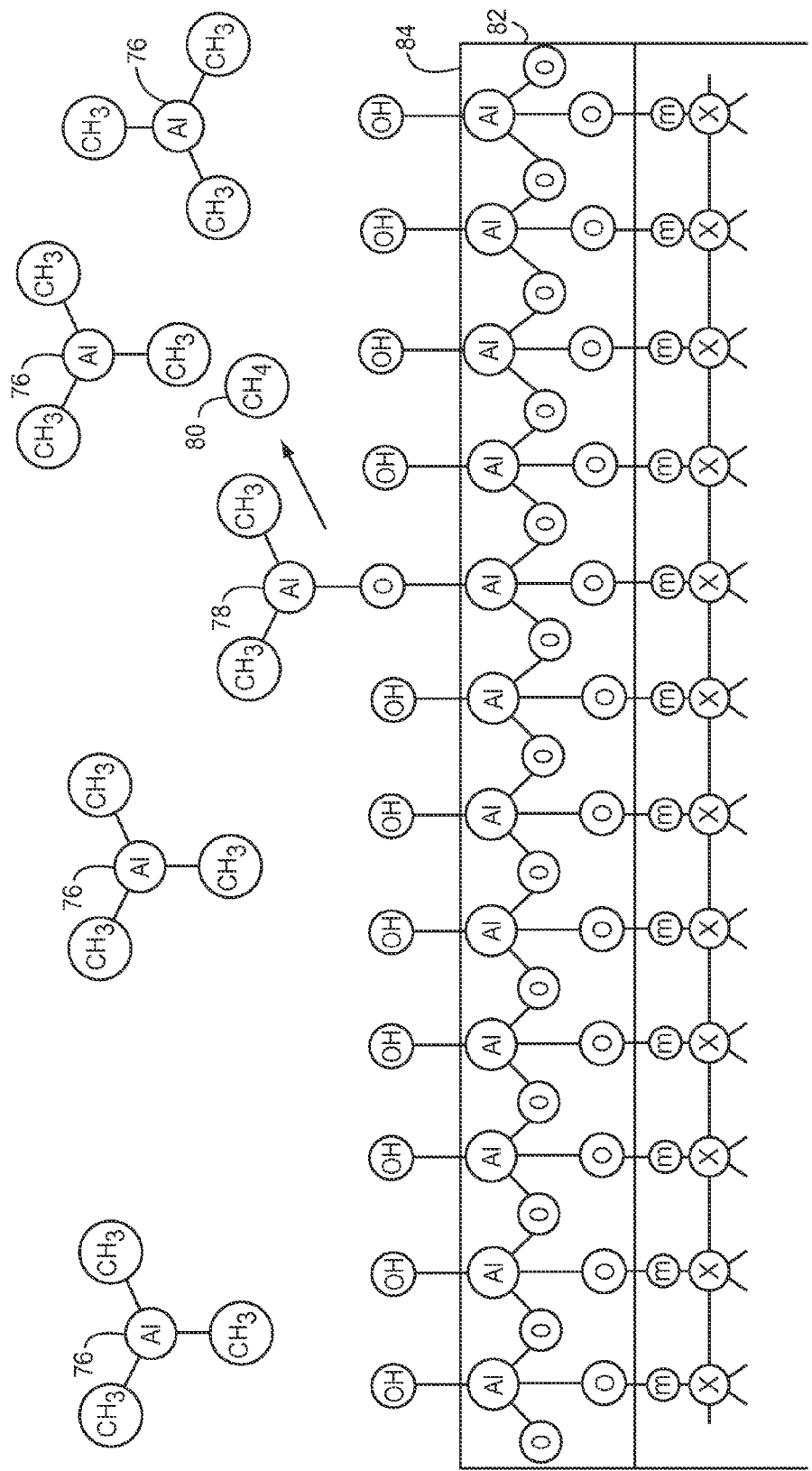
Figure 4J:
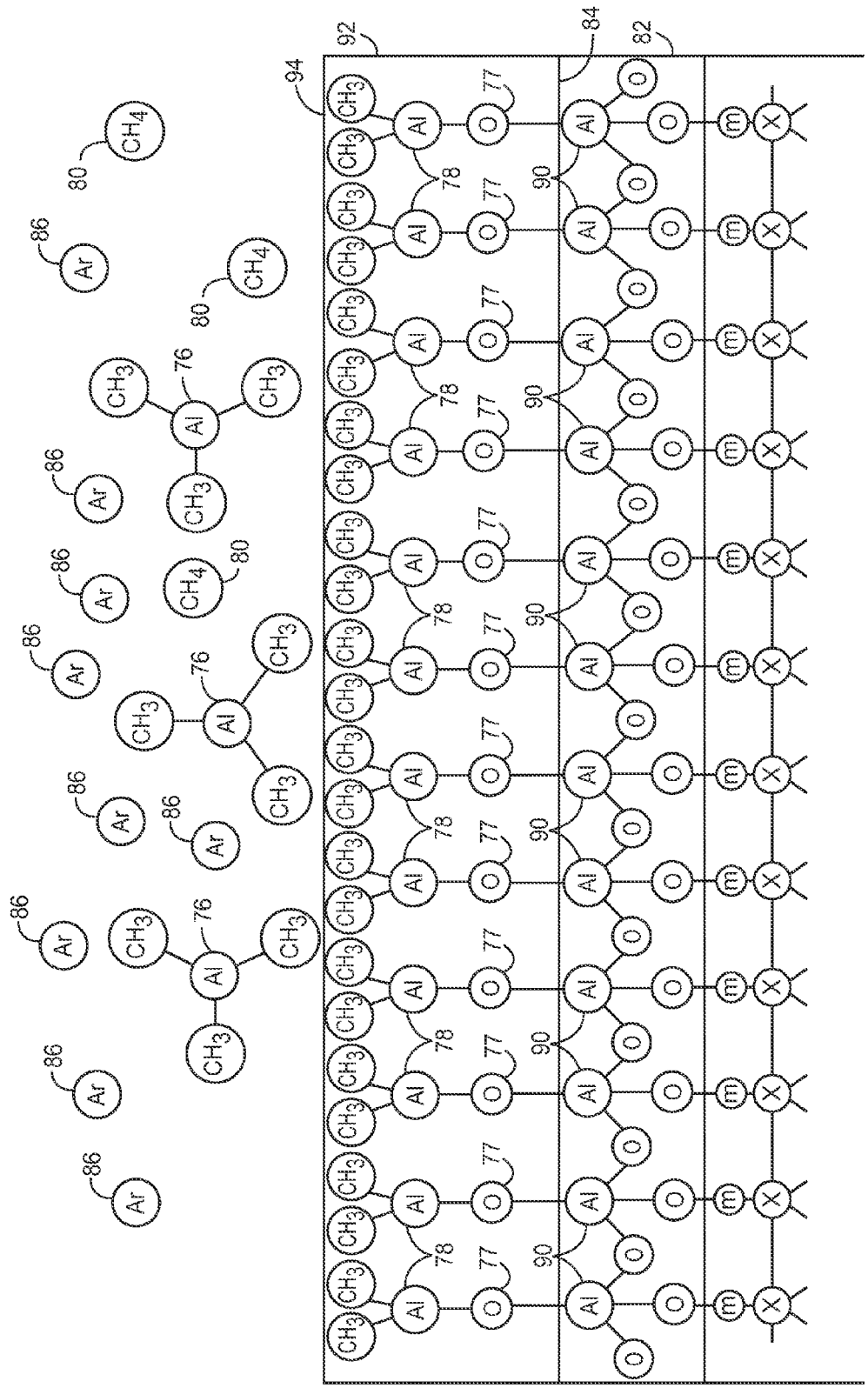
Figure 4K:
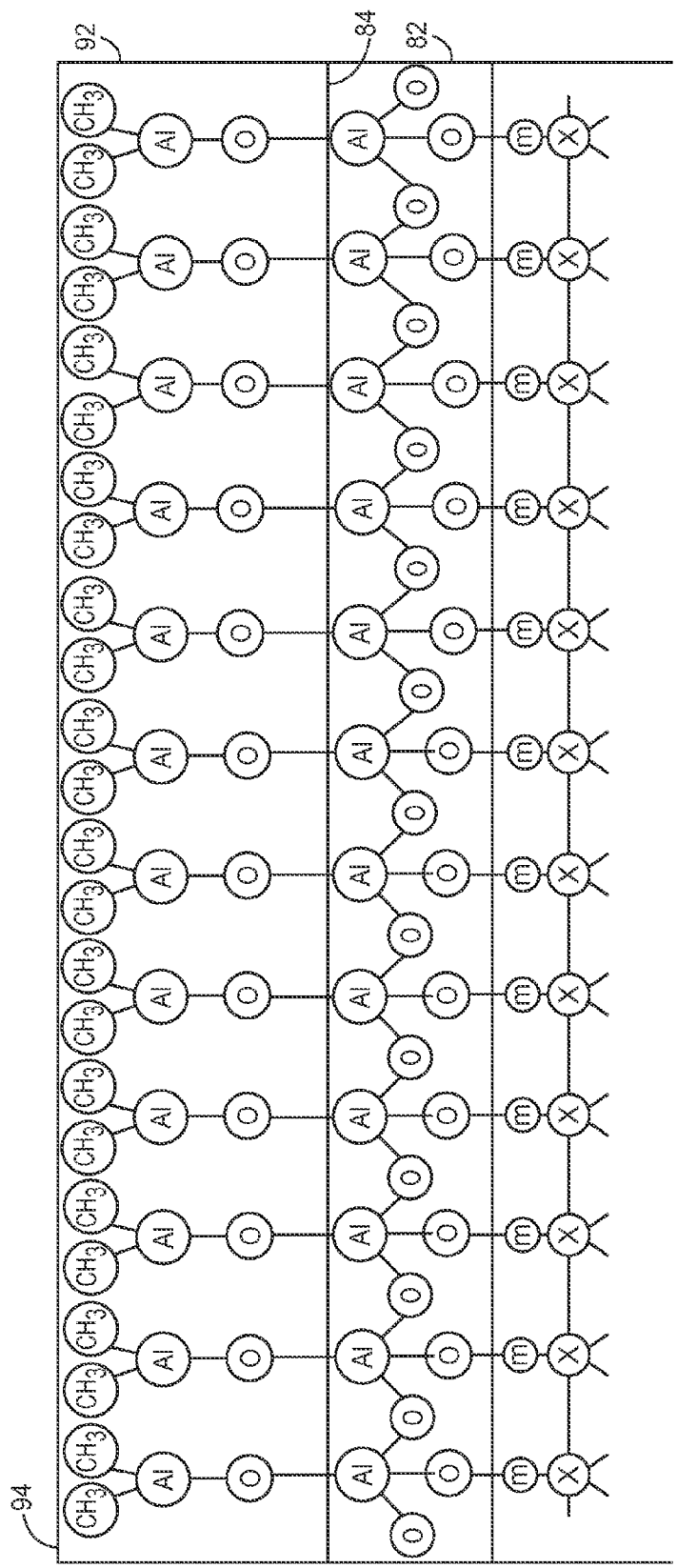
Figure 4L:
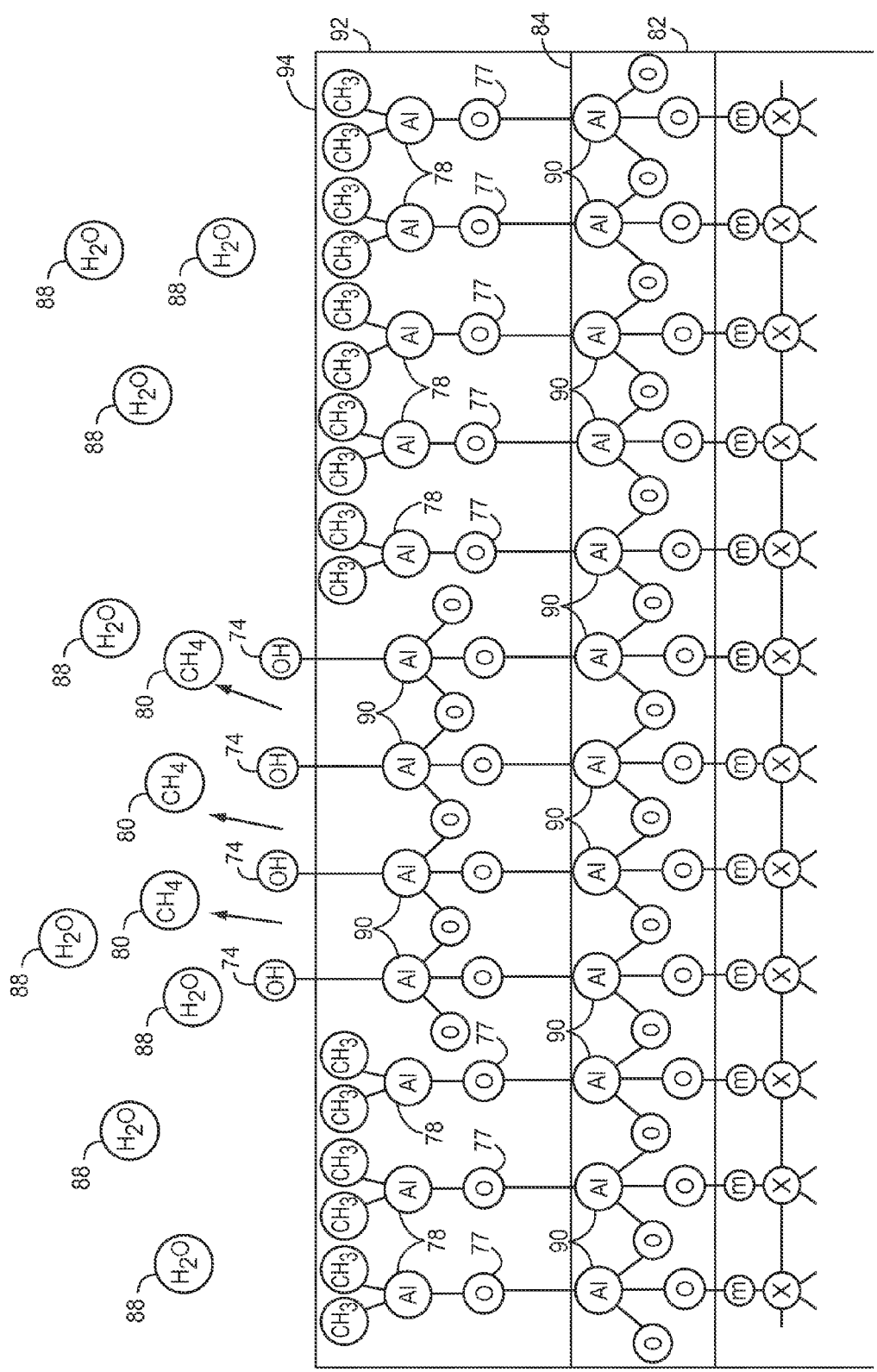
Figure 4M:
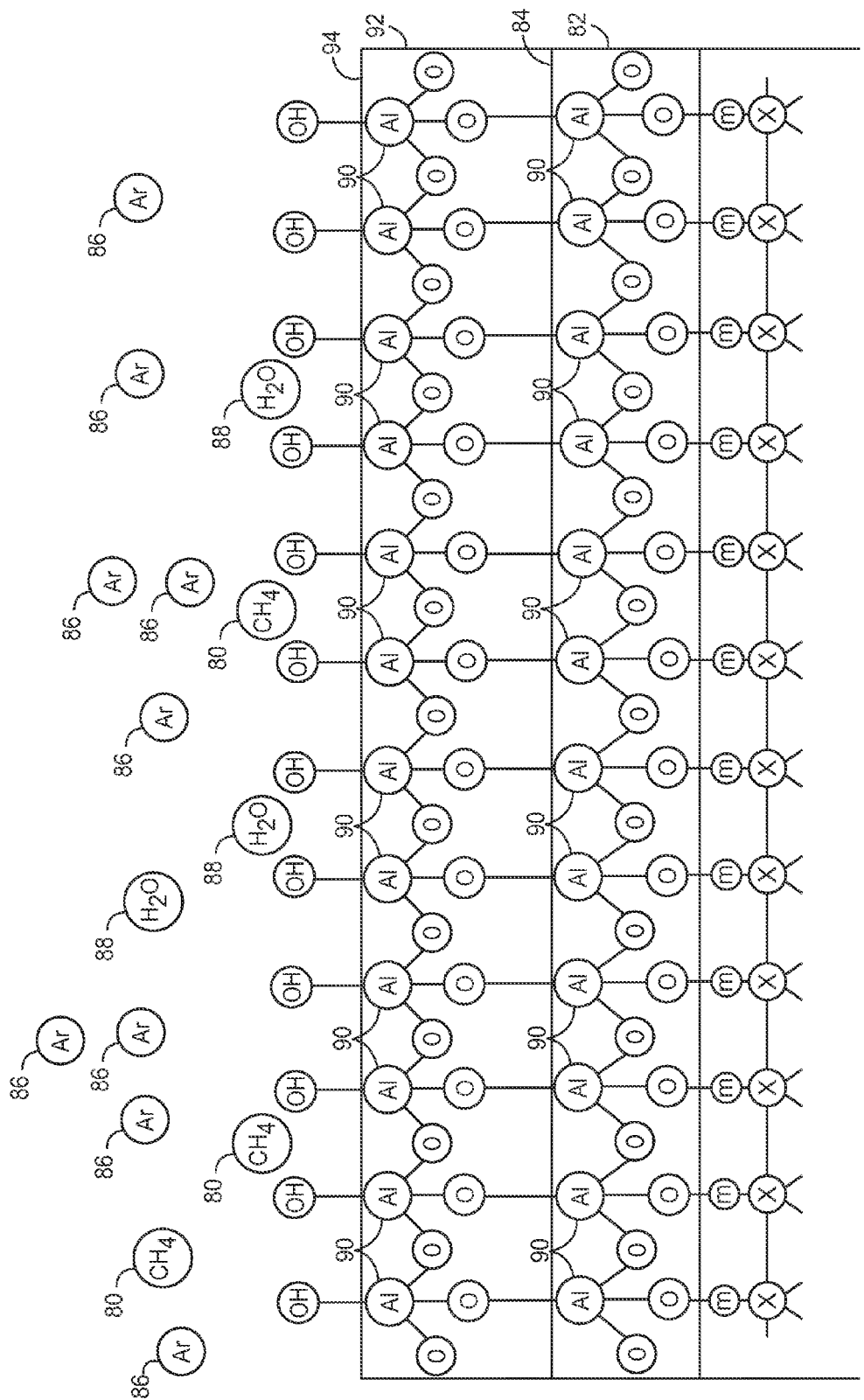
Figure 4N:
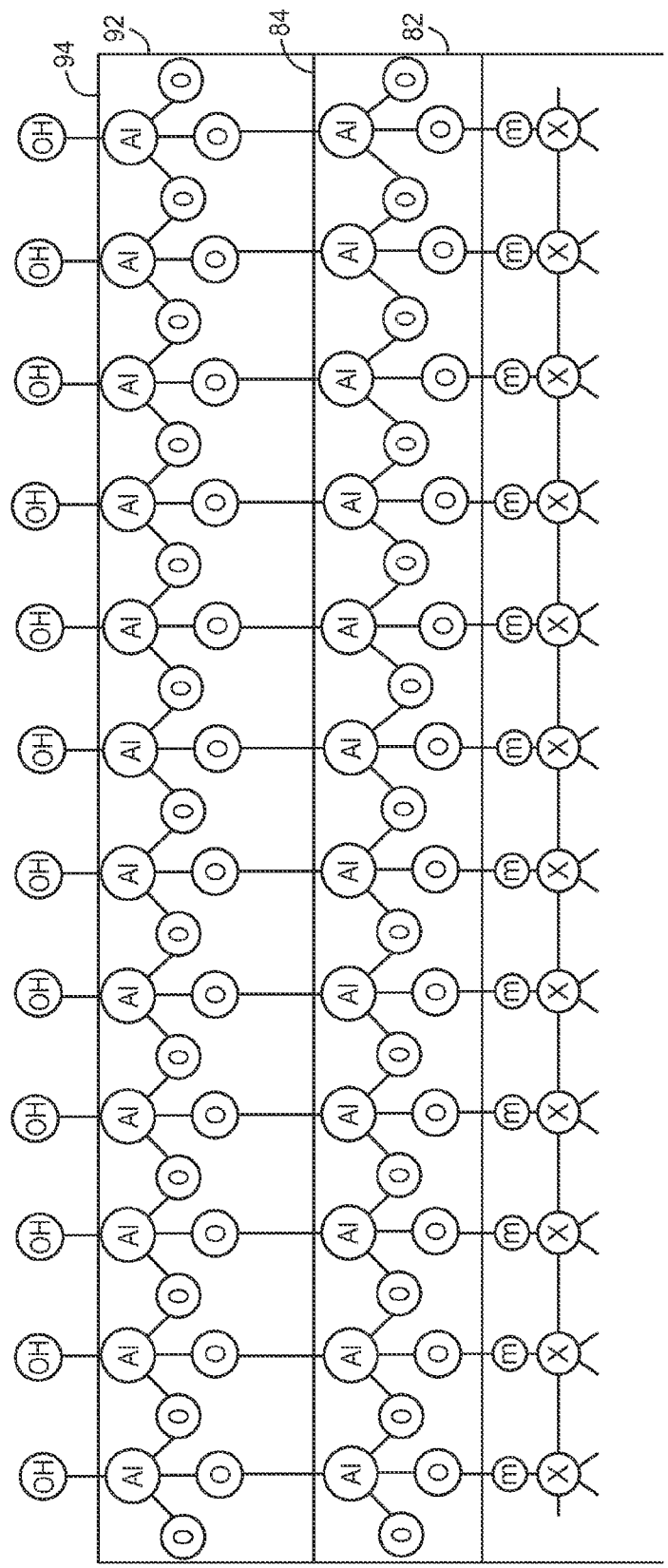

FIGS. 4A-4N illustrates steps for one embodiment of the ALD process. Note that FIGS. 4A-4N are simply illustrative and additional steps or different steps may be utilized to implement the ALD process, as shall be recognized by those of ordinary skill in the art in light of this disclosure. Also, FIGS. 4A-4N show molecular representations of the materials and reactants involved in the ALD process. The molecular representations are not to scale and are simply illustrative. For example, the principles of quantum mechanics, such as Heisenberg's uncertainty principle and wave-particle duality, teaches that the position and momentum of a particle cannot be known to an arbitrarily high precision and thus representing molecules as positioned at a particular position is a simplification and not entirely accurate. However, the molecular representations in FIGS. 4A-4N are not intended to accurately depict molecules or molecular relationships but rather the depictions are simply provided to help illustrate steps and concepts related to the ALD process in this disclosure. With that cautionary note to the reader, molecules and atoms are represented in FIGS. 4A-4N by spheres whiles lines connecting the spheres represent covalent or ionic bonds between the atoms or molecules.

FIG. 4A represents a segment 70 of the acoustic wave device 10 at the surface 36 prior to forming the film 34 (shown in FIG. 2) on the acoustic wave device 10. While the processes described in FIGS. 4A-4N may take place along the entirety of the surface 36 of the acoustic wave device 10, the segment 70 of surface 36 is illustrated for practical reasons and for the purposes of clarity. The segment 70 illustrated in FIGS. 4A-4N may be any section of the surface 36 and thus molecules 72 of the acoustic wave device 10 at the surface 36 are labeled X because the type of material at the surface 36 may vary in accordance with the material of a particular section of the acoustic wave device 10 at the surface 36. For example, if the segment 70 were a segment of the piezoelectric substrate 20 and the piezoelectric substrate 20 were made of quartz, the molecules 72 would be of ($SiO_2$) and would be bonded to molecules (not shown) within the segment 70 to form a silicon-oxygen tetrahedral. On the other hand, if the segment 70 were a segment of the IDT 12, the molecules 72 may be aluminum (Al) atoms bonded to other aluminum atoms (not shown) in a solid lattice.

To form the film 34, the surface 36 of the acoustic wave device 10 is prepared for the ALD process. Accordingly, the surface 36 of the acoustic wave device 10 may be hydroxylated so that hydroxyl (OH) 74 is bonded by metal molecules 73 to the molecules 72 along the surface 36 of the acoustic wave device 10 (FIG. 4B). This may be done by exposing the surface 36 to a metal bonded to a hydrogen containing ligand (not shown) and cleaning the surface 36. The composition of a metal bonded to a hydrogen containing ligand may depend on the particular materials used to form of the acoustic wave device 10. Once the surface 36 has been prepared, the hydroxyl (OH) 74 is bonded by metal molecules 73 to the molecules 72 along the surface 36 of the acoustic wave device 10, as shown in FIG. 4B.

Next, after preparing the surface 36 the initial layer deposition cycle of the ALD process may begin. The surface 36 may be heated to between around about 50° C. and 350° C. During a first time period of the initial layer deposition cycle, the first precursor may be introduced into the reaction chamber 50, which exposes the surface 36 of the acoustic wave device 10 to the first precursor (FIG. 4C). In this case, the first precursor is a trimethylaluminum gas ($Al(CH_3)_3$) 76 but may also include other reactants to assist in the reaction, if desired. The trimethylaluminum gas 76 reacts with the hydroxyl 74 to dehydroxylate the surface 36 and form methylaluminumoxane ($OAl(CH_3)_2$) 78 and methane ($CH_4$) 80 as a byproduct. The molecules 72 on the surface 36 are dehydroxilated and the reaction creates methane ($CH_4$) 80 as a byproduct. During the first time period of the initial layer deposition cycle, the trimethylaluminum gas 76 may be introduced until the surface 36 is saturated. If the reaction chamber 50 (shown in FIG. 3) provides the surface 36 at the appropriate temperature and appropriate vacuum conditions, the reaction may self-terminate upon saturation when the hydroxyl 74(shown in FIG. 4B) along the surface 36 of the acoustic wave device 10 is consumed by the reaction. The reaction may be exothermic in that the reaction chamber 50 may heat the surface 36 so that the temperature range of the surface 36 allows the reaction to go to completion but is not so high as to cause decomposition of the first precursor.

The reaction with the first precursor creates a monolayer 82 of methylaluminumoxane 78 on the surface 36 of the acoustic wave device 10 (FIG. 4D). The methylaluminumoxane 78 of the monolayer 82 is bonded to the metal molecules 73 and the molecules 72 on the surface 36 of the acoustic wave device 10 through the oxygen (O) atom 77. A surface 84 of the monolayer 82 is methylated since melythium ($CH_3$) is bonded along the surface 84. During the first time period, the trimethyaluminum gas 76 may be introduced until the surface 36 is saturated. If the reaction chamber 50 provides the appropriate vaccum conditions, the reaction may self-terminate upon saturation since the hydroxyl 74 (shown in FIG. 4B) along the surface 36 of the acoustic wave device 10 has been consumed by the reaction.

Next, during a second time period of the initial layer deposition cycle, the reaction chamber 50 may be purged to remove byproducts, such as methane 80 and unreacted trimethyaluminum gas 76 from the surface 84 of the monolayer 82. In this example, the reaction chamber 50 is purged by introducing an inert gas, such as an Argon gas (Ar) 86, into the reaction chamber 50 which may be heated to a decomposition temperature. However other inert gas such as, nitrogen gas ($N_2$), helium (He), and the like may also be utilized. The surface 84 of the monolayer 82 is exposed to the Argon gas 86. The reaction chamber 50 may also be evacuated to remove the byproducts and excess trimethylaluminum gas 76. As a result, the surface 84 of the monolayer 82 is cleaned (FIG. 4E).

Next, during a third time period of the initial layer deposition cycle, a second precursor may be introduced into the reaction chamber 50 (FIG. 4F). In this embodiment, the second precursor is made from water vapor ($H_2O$) 88, but in the alternative, the second precursor may also be an oxygen gas ($O_2$) mixed with carbon dioxide ($CO_2$), an oxygen plasma mixed with carbon dioxide ($CO_2$), or the like. The methyaluminumoxane 78 of the monolayer 82 reacts with the water vapor 88, which demethylates the surface 84, and forms alumina 90. A byproduct of the reaction is methane 80. The alumina 90 formed by the reaction and is bonded to hydroxyl 74. If the reaction chamber 50 provides the appropriate vaccum conditions and provides the monolayer 82 at the appropriate temperature, the reaction may self-terminate upon saturation since the methylaluminumoxane 78 of the monolayer 82 has been consumed by the reaction with the water vapor 88. This reaction may also be exothermic in that the reaction chamber 50 may heat the monolayer 82 so that the temperature range of the monolayer 82 allows the reaction to go to completion but is not so high as to cause decomposition of the second precursor.

The reaction of methylaluminumoxane 78 and the second precursor thus forms the monolayer 82 into a monolayer 82 of alumina 90 and hydroxilates the surface 84 of the monolayer 82 (FIG. 4G). This monolayer 82 thus forms the first layer of the film 34 over the surface 36 of the acoustic wave device 10. The monolayer 82 may be less than about 0.1 Angstroms in thickness, since ideally the monolayer is a single molecule in thickness. Note, while the monolayer 82 is ideally a single molecule in thickness, practical considerations and non-ideal conditions may cause the monolayer 82 to be a non-ideal monolayer and have limited sections that may be a few molecules in thickness.

Next, during a fourth time period of the initial layer deposition cycle, the reaction chamber 50 may be purged to remove byproducts, such as methane 80 and unreacted water vapor 88 from the surface 84 of the monolayer 82. The surface 84 of the monolayer 82 may be purged by being exposed to the Argon gas 86 and by another evacuation of the reaction chamber 50. This again cleans the surface 84 of the monolayer 82 (FIG. 4H). This monolayer 82 can then be cured and cleaned again after curing, if desired.

The subsequent layer deposition cycle may now begin. As discussed above, the surface 84 of the monolayer 82 has been hydroxylated. The surface 84 may be heated between about 50° C.-350° C. During a first time period of the next layer deposition cycle, the surface 84 of the monolayer 82 may be exposed to the first precursor, which as discussed above, the first precursor is or includes trimethyaluminum gas 76 (FIG. 4I). The trimethyaluminum gas 76 reacts with the hydroxyl 74 to dehydroxylate the surface 84 and form methyaluminumoxane (OAl(CH$_3$)$_2$) 78 and methane (CH$_4$) 80 as a byproduct. During the first time period of the subsequent layer deposition cycle, the trimethyaluminum gas 76 may be introduced until the surface 84 of the monolayer 82 is saturated. If the reaction chamber 50 provides the surface 84 at the appropriate temperature and appropriate vacuum conditions, the reaction may self-terminate upon saturation when the hydroxyl 74 (shown in FIG. 4H) along the surface 36 of the acoustic wave device 10 is consumed by the reaction. The reaction may be exothermic in that the reaction chamber 50 may heat the surface 84 so that the temperature range of the surface 84 allows the reaction to go to completion but is not so high as to cause decomposition of the first precursor.

The trimethyaluminum gas 76 reacts with the surface 84 of the monolayer 82 to form methyaluminumoxane 78. The surface 84 of the monolayer 82 is thus dehydroxilated and the reaction produces methane (CH$_4$) 80 as a byproduct. During the first time period of this layer deposition cycle, the trimethyaluminum gas 76 may be introduced until the monolayer 82 is saturated.

The trimethyaluminum gas 76 reacts with the surface 84 of the monolayer 82 to form methyaluminumoxane 78. The surface 84 of the monolayer 82 is thus dehydroxilated and the reaction produces methane (CH$_4$) 80 as a byproduct. Accordingly, another monolayer 92 of methyaluminumoxane 78 is created over the surface 84 of the earlier monolayer 82 (FIG. 4J). The methyaluminumoxane 78 of the monolayer 92 is bonded to the alumina 90 of the earlier formed monolayer 82 through the oxygen atom 77. A surface 94 of the monolayer 92 is methylated since melythium is bonded along the surface 94 of the monolayer 92. Next, during a second time period of the layer deposition cycle, the reaction chamber 50 may be purged to remove byproducts, such as methane 80 and unreacted trimethyaluminum gas 76 from the surface 94 of the monolayer 92 by exposing the surface 94 to the inert gas, which in this example is Argon gas 86 that has been heated to the decomposition temperature. The reaction chamber 50 may also be evacuated during the second time period to remove the byproducts and excess trimethyaluminum gas 76 from the surface 84. In this manner, the surface 94 of the monolayer 92 is cleaned (FIG. 4K).

Next, during a third time period of the layer deposition cycle, the second precursor may be introduced into the reaction chamber 50 (FIG. 4L). The water vapor 88 of the second precursor reacts with the methyaluminumoxane 78 of the monolayer 92 which forms alumina 90 which demethylates the surface 94 and a byproduct of the reaction is methane 80. The alumina 90 formed in the monolayer 92 by the reaction is also bonded to the hydroxyl 74 and a byproduct of the reaction is methane 80. The reaction of methyaluminumoxane 78 and the second precursor thus forms the monolayer 92 into the monolayer 92 of alumina 90 (FIG. 4M). During the third time period of the layer deposition cycle, the water vapor (H$_2$O) 88 may be introduced until the monolayer 92 is saturated and the monolayer 92 is transformed into the monolayer 92 of alumina 90 having the surface 94 that is hydroxilated. The reaction may be exothermic in that the reaction chamber 50 may heat the monolayer 92 so that the temperature range of the monolayer 92 allows the reaction to go to completion but is not so high as to cause decomposition of the second precursor.

Thus, this layer deposition cycle forms another monolayer 92 of alumina 90 in the film 34 on the surface 84 of the previously formed monolayer 82.

Finally, during a fourth time period of the layer deposition cycle, the reaction chamber 50 may be purged to remove byproducts, such as methane 80 and unreacted water vapor 88 from the surface 94 of the monolayer 92 by introducing the inert gas, which in this case is Argon gas 86 that has been heated to a decomposition temperature. The reaction chamber 50 may also be evacuated during the fourth time period to remove the byproducts and excess water vapor 88 from the surface 84. In this manner, the surface 94 of the monolayer 92 is cleaned and the hydroxilated surface 94 is provided to form the next monolayer (FIG. 4N). The monolayer 92 may then be cured and cleaned again.

Referring again to FIGS. 2, 3, and 4A-4N, subsequent deposition cycles can repeat the steps described above in FIGS. 4I-4N to form and stack additional monolayers over the surface 36 of the acoustic wave device 10. As shown by the formation of the monolayer 82 of alumina 90 in FIGS. 4C-4H and the formation of monolayer 92 of alumina 90 in FIGS. 4I-4N, the ALD process may divide the formation of each monolayer 82, 92 into two self-terminating surface reactions, one surface reaction with the first precursor having the trimethyaluminum gas 76 (FIG. 4C and FIG. 4I) and another surface reaction with the second precursor, which in this case has water vapor 88 (FIG. 4F and FIG. 4L). If the alumina 90 were simply sputtered onto the surface 36 or formed by a single reaction, like in sputtering deposition processes and CVD processes, then excessive amounts of material would be formed on the surface 36 since the amount of material deposited would be dependent on the accuracy of the control device 60 in providing precise amounts of material or reactants within the reaction chamber 50. However, by dividing the formation of each of the monolayers 82, 92 into two surface reactions, the amounts of each precursor provided into the reaction chamber 50 may have little or no effect on the amount of alumina 90 formed assuming the appropriate conditions are provided within the reaction chamber 50.

The self-limiting reactions of the first precursor and the second precursor self-terminate upon saturation thereby allowing monolayers 82, 92 of alumina to be formed. Accordingly, the ALD process may be less sensitive to the flux uniformity of each of the precursors into the reaction chamber 50. Instead, lack of flux uniformity into the reaction chamber 50 simply results in different completion times along different areas and provides sufficient time for the monolayers 82, 92 to still be formed with high precision.

Also, the first precursor and the second precursor may be gases, such as trimethyaluminum gas 76 and the water vapor 88, respectively, which can easily flow into areas that have high aspect ratios, which screen shadow areas 48. The ALD process can thus provide a uniform and conformal film 34 on shadow areas 48 even when the surface 36 has high aspect ratios. This is particularly important for the acoustic wave device 10, since acoustic wave devices 10 may be very sensitive to variations and to the mass loading effects of the film 34. In addition, the shadow areas 48 do not cause the film 34 to be formed substantially free from pin-holes and voids, thereby, ensuring the acoustic wave device 10 is adequately protected from environmental conditions.

Note, FIGS. 4A-4N describe each layer deposition cycle as depositing a single monolayer 82, 92 per layer deposition cycle. In the alternative, multiple monolayers may be provided per layer deposition cycle by repeating the steps described above in FIGS. 4I-4N during additional time periods of each one of the layer deposition cycle. For example, after the first through fourth time periods of the layer deposition cycle described in FIGS. 4I-4N, the steps described in FIGS. 4I-4N may be repeated during a fifth through an eight time period of the layer deposition cycle to form another monolayer. This can be done repeatedly throughout the length of the layer deposition cycle. One layer deposition cycle may deposit from about 1 to 400 monolayers of the film 34 and thus provide a layer of the film 34 from a monolayer, up to a molecular layer about 400 molecules in thickness. After each layer deposition cycle, the molecular layer is cured and additional molecular layers may be provided over the surface 36 during subsequent layer deposition cycles. Currently, layer deposition cycles may be from around 0.5 seconds to several seconds, depending on the desired thickness of the molecular layer provided per layer deposition cycle and the equipment being used to create the molecular layer. To form molecular layers, the layer deposition cycles may be divided into pulse sequences of the first precursor, second precursor, and inert gas in which the time periods described above for FIGS. 4I-4N may be continuously repeated during other time periods of the layer deposition cycle. After each of the layer deposition cycles, the molecular layers formed by the layer deposition cycle may be allowed to cure.

Those skilled in the art will recognize improvements and modifications to the preferred embodiments of the present disclosure. All such improvements and modifications are considered within the scope of the concepts disclosed herein and the claims that follow.

What is claimed is:

1. A method of coating a surface of an acoustic wave device, comprising:
    exposing the acoustic wave device to a first precursor, the first precursor comprising a trimethyaluminum gas that reacts with the surface of the acoustic wave device to form a first monolayer of methyaluminoxane over the surface of the acoustic wave device; and
    exposing the first monolayer to a second precursor that reacts with the methyaluminoxane of the first monolayer so that the first monolayer comprises alumina.

2. The method of claim 1 wherein the second precursor comprises water vapor.

3. The method of claim 1, further comprising after exposing the acoustic wave device to the first precursor but before exposing the first monolayer to the second precursor, cleaning the surface of the first monolayer.

4. The method of claim 3, further comprising after exposing the first monolayer to the second precursor, again cleaning the surface of the first monolayer.

5. The method of claim 1 wherein, after exposing the first monolayer to the second precursor, the first monolayer has a surface that is hydroxylated.

6. The method of claim 5, further comprising:
    exposing the first monolayer to the first precursor, which reacts with the surface of the first monolayer to form a second monolayer comprising methyaluminoxane over the first monolayer; and
    exposing the second monolayer to the second precursor, which reacts with the methyaluminoxane of the second monolayer so that the second monolayer comprises alumina and has a surface that is hydroxylated.

7. The method of claim 6, further comprising:
    cleaning the surface of the first monolayer after exposing the acoustic wave device to the first precursor but before exposing the first monolayer to the second precursor; and
    again, cleaning the surface of the first monolayer after exposing the first monolayer to the second precursor but before exposing the first monolayer to the first precursor.

8. The method of claim 7, further comprising cleaning the surface of the second monolayer after exposing the first monolayer to the first precursor but before exposing the second monolayer to the second precursor.

9. The method of claim 1, further comprising hydroxilating the surface of the acoustic wave device prior to exposing the acoustic wave device to the first precursor.

10. The method of claim 1 wherein the acoustic wave device comprises a piezoelectric substrate and a transducer formed in the piezoelectric substrate wherein the surface of the acoustic wave device comprises a surface of the piezoelectric substrate and a surface of the transducer.

11. The method of claim 10 wherein the transducer of the acoustic wave device comprises aluminum.

12. The method of claim 1, further comprising heating the surface of the acoustic wave device.

13. The method of claim 1 wherein after exposing the first monolayer to the second precursor, the first monolayer is less than 0.1 Angstroms in thickness.

* * * * *